United States Patent
Ulm et al.

(10) Patent No.: US 7,414,351 B2
(45) Date of Patent: Aug. 19, 2008

(54) ENERGY HARVESTING DEVICE MANUFACTURED BY PRINT FORMING PROCESSES

(75) Inventors: Markus Ulm, Wannweil (DE); Brian Stark, San Francisco, CA (US); Matthias Metz, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/541,966

(22) Filed: Oct. 2, 2006

(65) Prior Publication Data

US 2008/0079333 A1    Apr. 3, 2008

(51) Int. Cl.
*H01L 31/00* (2006.01)
(52) U.S. Cl. .................. 310/330; 310/332; 310/348
(58) Field of Classification Search ............ 310/330, 310/331, 332, 339; 367/160
See application file for complete search history.

(56) References Cited

U.S. PATENT DOCUMENTS

| | | | |
|---|---|---|---|
| 3,456,134 A * | 7/1969 | Ko | 607/35 |
| 6,938,311 B2 * | 9/2005 | Tanielian | 29/25.35 |
| 2002/0089261 A1 * | 7/2002 | Beaver | 310/330 |
| 2004/0202338 A1 * | 10/2004 | Longbottom et al. | 381/190 |
| 2006/0022555 A1 * | 2/2006 | Balasubramaniam et al. | 310/339 |

\* cited by examiner

*Primary Examiner*—Darren Schuberg
*Assistant Examiner*—Bryan P Gordon
(74) *Attorney, Agent, or Firm*—Courtney Staniford & Gregory LLP

(57) ABSTRACT

Embodiments of making an energy harvesting device are described. In one embodiment, a case and integrated piezoelectric cantilever to harvest vibration energy from an environment being sensed is produced via a print forming method injection molding method. The cantilever device consists of a piezoelectric material member, and a proof mass of high density material coupled to the piezoelectric member. The print forming method is used to build up the base and walls of the device as well as the neutral layers of the piezoelectric member. Metal layers are printed to form the electrode layers of the piezoelectric member and the electrical contact portions of the device. Passive components can also be formed as part of the layers of the device. The entire assembly can be encapsulated in plastic.

16 Claims, 18 Drawing Sheets

US 7,414,351 B2

ENERGY HARVESTING DEVICE MANUFACTURED BY PRINT FORMING PROCESSES

FIELD

Embodiments of the invention relate generally to miniaturized electrical systems, and specifically to devices for harvesting energy.

BACKGROUND

The use of miniaturized electrical systems (Microsystems) on the order of 1 cm$^2$ has been proposed to provide distributed sensing capability. Microsystem sensors can be used to monitor various environmental and operational conditions and transmit signals back to a host receiver for many different applications, such as industrial monitoring, security applications, weather prediction, and so on. The design and implementation of such devices and systems requires overcoming several challenges, such as designing small and robust packaging and providing adequate transmitter power. A major consideration in designing such systems remains providing adequate electrical power, and for many Microsystems, this challenge remains a significant obstacle. In general, current miniature battery technologies cannot store enough energy to power these systems for long periods of time, such as on the order of months. Another disadvantage of battery use is that many sensor applications involve harsh or limited access environments that can limit or disable battery performance and/or render battery maintenance virtually impossible.

One approach to overcome the problem of providing enough battery power for microsystems is to extract energy from the surrounding environment. This approach, which is called energy harvesting (or scavenging) eliminates the need for an external or stored power supply, thus allowing a system to be made fully autonomous, that is, one that requires no external power connections or maintenance. As long as the source of environmental energy is available, an energy harvesting microsystem can remained fully powered, virtually non-stop, while providing information to the user.

Several techniques have been proposed and developed to extract energy from the environment. The most common available sources of energy are vibration, temperature, and stress (pressure). In many environmental applications, vibration energy may be the most readily available and easiest to convert into electricity. In general, vibration energy can be converted into electrical energy using one of three techniques: electrostatic charge, magnetic fields, and piezoelectric materials. Piezoelectric generation of electricity from vibration energy typically represents the most cost-effective approach, as the electrostatic and magnetic techniques usually require more extensive design, packaging, and integration work to adapt to particular applications.

Current methods of manufacturing small piezoelectric energy harvesting devices typically involve traditional PC (printed circuit) board techniques in which components are mounted on a PC and then integrated into a separate housing or other structure. Such methods are typically expensive and inefficient when small-scale devices are produced. Moreover, for applications in which vibration energy is converted to electrical energy, a rigid platform for the piezoelectric elements must be provided to maximize energy generation. Present methods of piezoelectric device manufacture typically involve mounting or attaching a piezoelectric beam to a separate case. Even if the bond between the case and beam is strong, the attachment point often represents a source of energy loss due to vibrational transmission and/or losses in the interface region.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Embodiments of an energy harvesting device manufactured through print-forming methods are described. In one embodiment, a screen printing process, or similar print-forming technology is used to produce an energy harvesting device that can be used to power small-scale sensor circuits, such as a tire pressure monitoring system or similar systems. The print-forming process involves adding successive layers of different screen printed materials to a substrate to build the device. After the device has been formed by the printing process, it is fired or cured to form a finished product. In one embodiment, a piezoelectric cantilever is incorporated within the screen printed structure to form the energy harvesting segment of the device. The piezoelectric cantilever can be a bimorph or multimorph cantilevered beam (or other similar structure) that vibrates under an externally applied load. This cantilever is surrounded by an external shell (package) of a material, such as ceramic that provides the multiple roles of: electrical interconnect, environmental shielding, and overtravel protection. Such a device can be used to provide power to sensor systems deployed in various vibration intensive environments, such as tire pressure monitoring systems, seismic systems, and the like.

In the following description, numerous specific details are introduced to provide a thorough understanding of, and enabling description for, embodiments of a print-forming manufactured energy harvesting device. One skilled in the relevant art, however, will recognize that these embodiments can be practiced without one or more of the specific details, or with other components, systems, and so on. In other instances, well-known structures or operations are not shown, or are not described in detail, to avoid obscuring aspects of the disclosed embodiments.

Microsystem sensors can be used in a variety of different environments to provide signals that represent one or more characteristics or parameters of the environment being sensed. One critical consideration in the installation of microsystems is providing power to the sensor. Many environments in which microsystem sensors are deployed either produce or are subject to vibrations. In one embodiment, an energy harvesting device uses vibration energy present in an environment being sensed to produce electricity to power the sensor.

Figure 1:
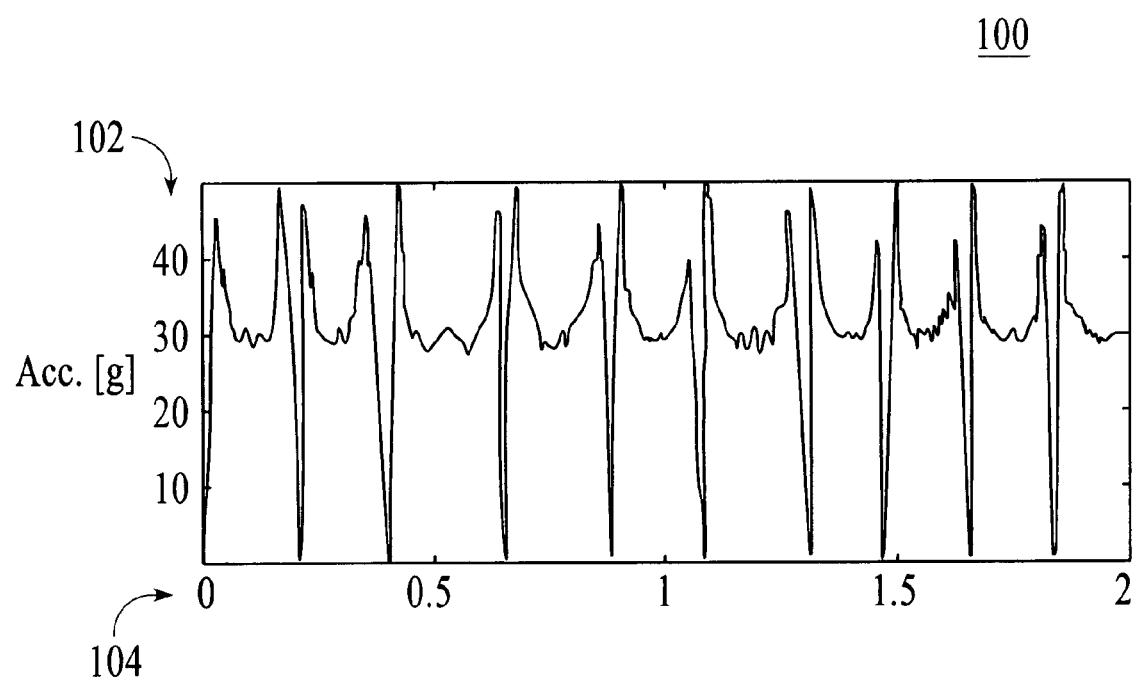
FIG. 1 illustrates vibration energy, such as in a rotating tire that can be used in an energy harvesting device according to an embodiment.

Automotive applications represent one field where vibration energy from motion of the vehicle in use is readily present and can be used to provide power to sensor networks in a car. In one embodiment, an energy harvesting device is used in a tire pressure sensing module that is deployed inside of an automobile, truck or other vehicle or machine tire to sense the air pressure inside of the tire and transmit the air pressure information to a control or processor module that can report low or abnormal tire pressures. The rubber carcass of a tire as it rolls along a surface produces vibrations that can be converted into electrical energy. FIG. 1 is a graph 100 that illustrates the acceleration in tire rubber as the tire rolls at a specific speed, such as 30 kilometers/hour. The accelerative force (in g's) along axis 102 is plotted against time (in seconds) 104 to A pressure sensor mounted within the tire, such as embedded within or coupled to the wheel or tire carcass can be used to monitor the pressure inside the tire. For this application, the use of a battery is impractical because the battery size and weight may impact the tire balance, excessively cold or warm temperatures within the tire can significantly affect battery performance, and replacement and disposal of the battery may be impractical or costly. In one embodiment, a piezoelectric cantilever or bender structure is used to provide the requisite energy to the tire pressure sensor. The piezoelectric bender converts the accelerative forces, such as those shown in FIG. 1, of the tire as it rolls into electricity for powering the pressure sensor.

In one embodiment, the energy harvesting device for use with a tire pressure sensor comprises a piezoelectric bender that includes a piezoelectric bimorph or multimorph structure. Piezoelectric materials are materials that convert vibration energy into electric energy. A single piece of piezoelectric material by itself is generally a unimorph structure that exhibits stress in equal and opposite directions under transverse loading. Consequently, the output voltage will be zero in the case of a sinusoidal vibration input. A bimorph structure has stress in one direction under a transverse load, and therefore outputs a non-zero voltage under the application of sinusoidal vibration. To provide adequate power output in a wide variety of different vibrating environments, a bimorph structure is generally preferred.

Figure 2A:
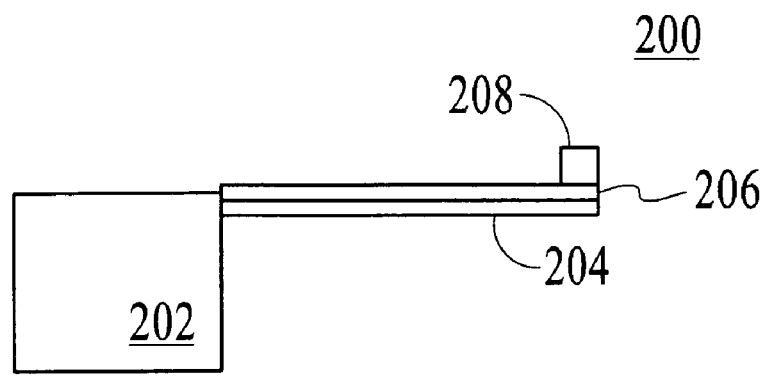
FIG. 2A illustrates a piezoelectric bimorph for use in an energy harvesting device, according to an embodiment.

FIG. 2A illustrates a piezoelectric bender for use in an energy harvesting device and utilizing a piezoelectric bimorph structure, according to an embodiment. The piezoelectric bender 200 consists of a base or housing 202, a piezoelectric element 206 attached to the plastic backing 204, and a proof mass 208 attached to the piezoelectric element 206. The proof mass could alternatively be attached to the plastic backing 204. The piezoelectric element 206 and plastic backing piece 204 together form the piezoelectric bimorph structure of the bender 200. In an alternative embodiment, the bimorph strip can be implemented as a piezo/metal or piezo/ piezo element, or a piezo stack comprising three or more elements in a sandwich array. Such an array is referred to as a "multimorph" structure.

In one embodiment, the bimorph beam made up of 204 and 206 is integrally formed as part of the base 202. This provides maximum rigidity of the beam and base structure. When a vibration force is induced onto bender structure 200, the bimorph beam consisting of backing 204 and piezoelectric material 206 is deflected with a motion proportional to the vibration force. This deflection is converted into electrical power, amplified, and then transmitted to other circuitry, such as that in a sensor coupled to structure 200.

In one embodiment, the piezoelectric material is Lead Zirconate Titanate (PZT), such as a PZT-5A type ceramic, and the proof mass is Tungsten. The body 202 and backing material 204 can be made of ceramic or any similar inactive material, such as plastic, nylon, and so on. One or more of the structures of FIG. 2A are formed by a print forming process in which the material is deposited in onto a surface in a series of layering steps by a screen-printing or similar process. In general, the material is deposited in liquid or semi-liquid form and hardens to form the final structure.

Figure 2B:
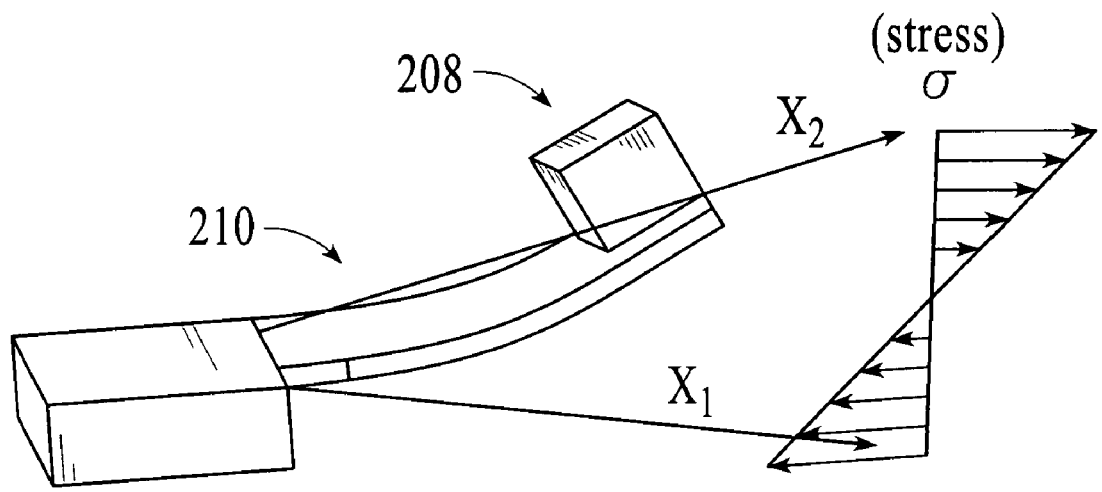
FIG. 2B illustrates the piezoelectric bimorph of FIG. 2A under a transverse loading.

FIG. 2B illustrates the piezoelectric bimorph of FIG. 2A under a transverse loading input, such as the vibration illustrated in FIG. 1. As illustrated in FIG. 2B, the piezoelectric bender 200 bends from a first position $x_1$ to a second position $x_2$, the amount of stress σ produced depends on the displacement of the proof mass from the first position to the second position. For an oscillating transverse input, such as a vibration, the piezo/plastic bimorph 210 will bend in the direction corresponding to the phase of the vibration, thus producing a positive stress value dependent on the magnitude of displacement caused by the transverse load. The PZT material of the bimorph integrates the stress to produce a power output. The proof mass serves to increase the stress force since the force is proportional to the mass of the bimorph strip and the induced acceleration.

Figure 3:
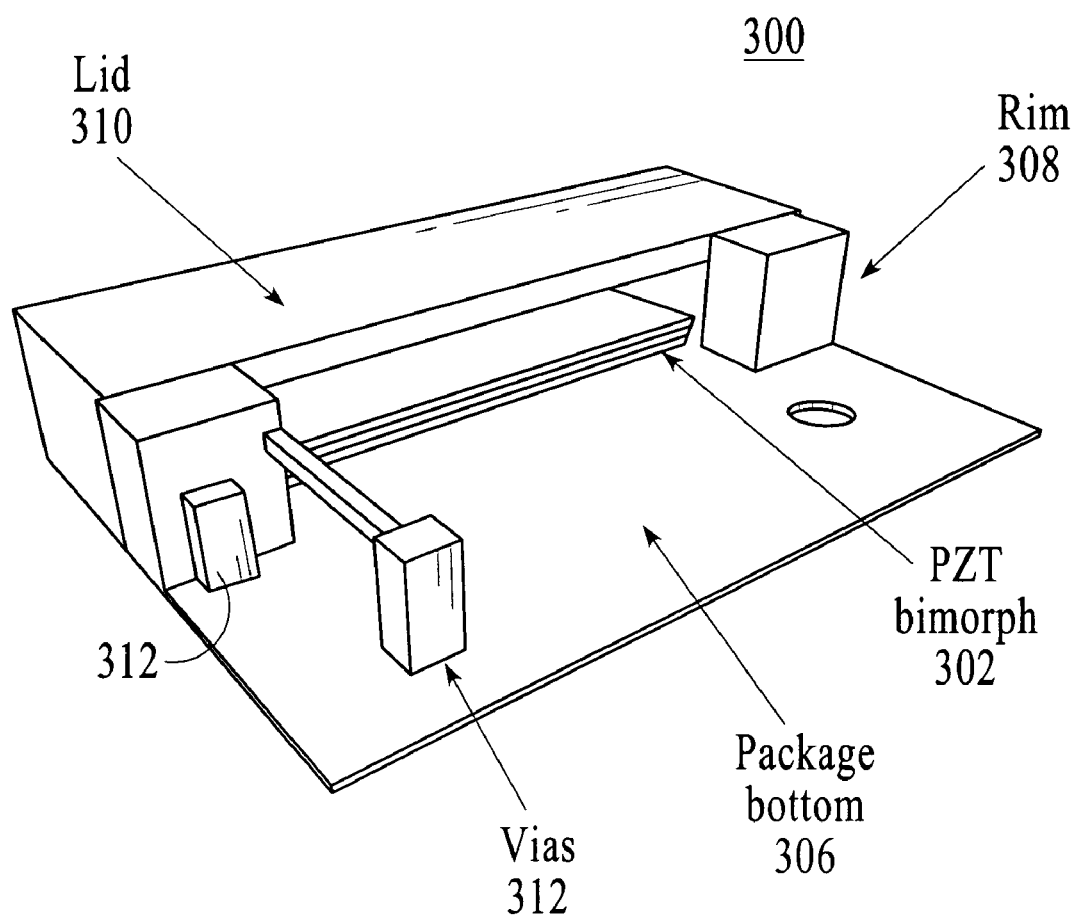
FIG. 3 illustrates a cut-away view of an energy harvesting device manufactured by a print-forming process, according to an embodiment.

In one embodiment, an energy harvesting device is made by a screen printing process that encapsulates a bimorph or multimorph piezoelectric strip within a miniaturized integrated package that can be deployed in many different applications. FIG. 3 illustrates a cut-away view of an energy harvesting device manufactured by a screen-printing process, according to an embodiment. As shown in FIG. 3, energy harvesting device 300 consists of a piezoelectric bimoiph or multimorph bender 302 (also referred to as a "cantilever beam") that is integrally connected to the body 304 of the device. A rim structure 308 is integrally connected to the package bottom 306 that forms the bottom of the device and surrounds the piezo-electric bender 302 to provide the side structures and define the body of the device. A lid 310 placed on top of the rim 308 covers the piezoelectric bender 302 and seals the device 300. One or more vias 312 are connected to a layer of the piezo-electric bender 302 to provide conductive connections to an electrical circuit coupled to the device 300. The energy harvesting segment of device 300 is formed by the piezoelectric bimorph cantilever beam 302 that vibrates under an externally applied load. The cantilever is surrounded by an external shell (package) made up of the package bottom 306, rim 38 and lid 310. The package surrounding the cantilever 302 provides the functions of electrical interconnect, environmental shielding, and over-travel protection. The external package can be made of an electrically inert material that is capable of hermetically sealing the cantilevered beam, such as ceramic or a dense composite, or similar material.

The energy harvesting device 300 including the cantilevered beam 302 and the external package that encapsulates it, is formed by a screen printing (print forming) process that involves laying down several successive layers of material. In one embodiment, the print forming process described utilizes the High-Volume Print Forming (HVPF™) process developed by EoPlex Technologies, Inc. This is a print forming method that allows three-dimensional solid or hollow structures to be created in a layered format using inorganic inks comprising ceramic and/or metal powders. During the firing process, these powders retain their printed shape but sinter to high density. A "negative" ink or sacrificial material is used to fill the areas where there is no positive ink to provide a flat surface for the next layer. The sacrificial ink burns or melts away during firing to create the desired cavities or channels within the structure. Other similar methods of screen printing that result in the build up of material on a base can also be used.

The external package consisting of at least one of the bottom 306, rim 308 and lid 310 can be formed from the same screen printing process that forms the cantilevered beam 302, or two or more different screen printing processes can be used to form these different elements.

Figure 4:
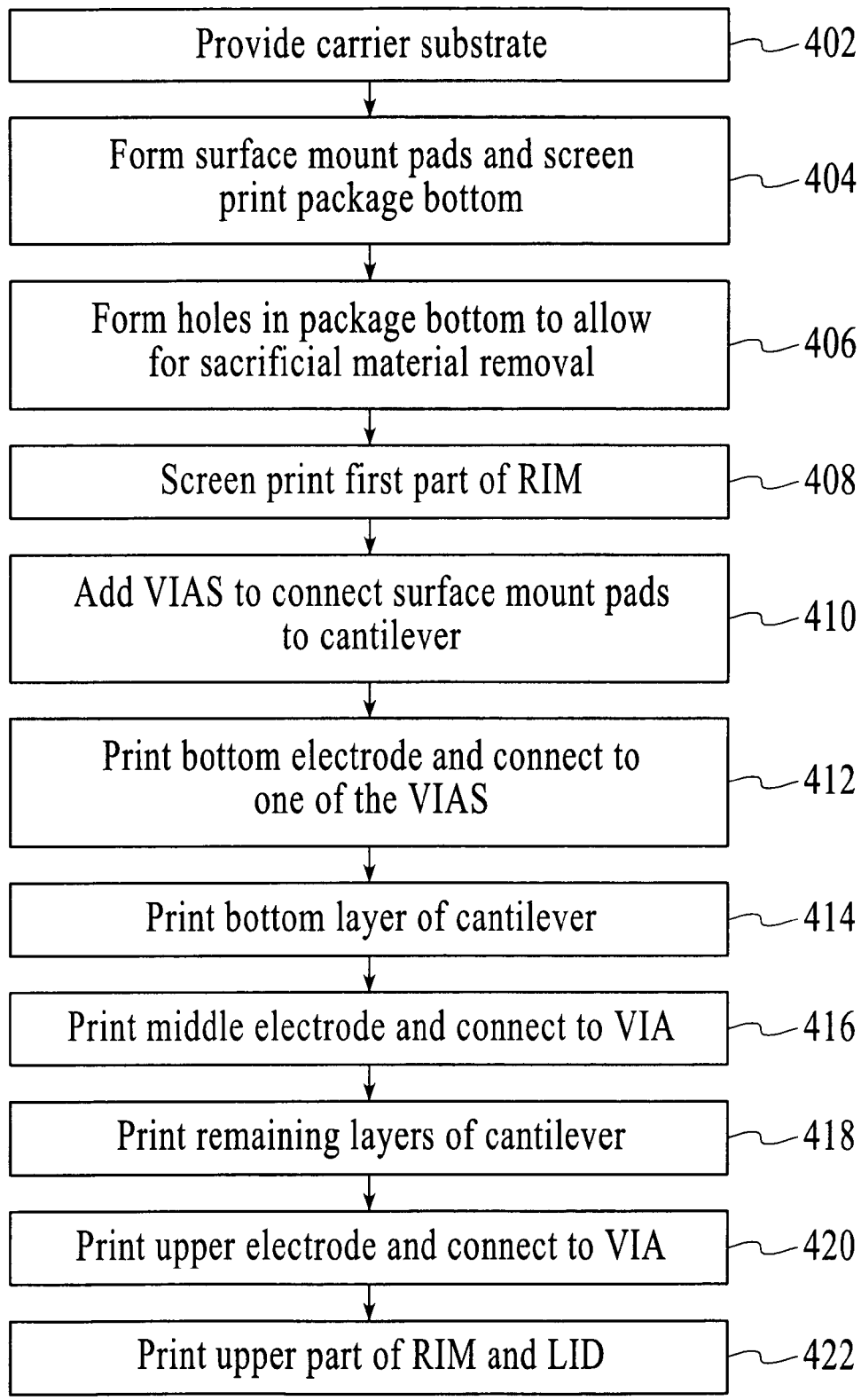
FIG. 4 is a flowchart that illustrates a method of manufacturing a print-formed energy harvesting device, according to an embodiment.

FIG. 4 is a flowchart that illustrates a method of manufacturing an encapsulated energy harvesting device, according to an embodiment. In step 402 a carrier substrate is provided. This can be a ceramic substrate or similar material. Upon the carrier substrate is formed the bottom of the package and the surface mount pads, 404. Holes are formed or drilled into the layer forming the bottom of the package to allow for later sacrificial material removal, 406. In step 408, the first part of the rim is printed around the device. Enough material should be deposited to provide a structure that sufficiently separates the cantilever beam from the bottom plate. Vias are added to connect the surface mount pads to the cantilever beam, step 410. The bottom electrode is then printed and connected to one of the vias, 412. In general, the electrodes comprise the metal layer portion of the piezoelectric bimorph. In step 414, the bottom layer of the cantilever bimorph is printed. This is an electrically inert (insulative) layer made by depositing the ceramic material of the housing. The middle electrode of the piezoelectric bimorph is then printed and connected to a via, step 416. The top portion of the piezoelectric bimorph is printed in step 418. If the cantilever beam is a multimorph structure, multiple layers of piezoelectric material and insulative materials can be laid down. If a proof mass is to be used with the cantilever beam, it is can also be formed beam structure by the same screen printing process. In step 420, the upper electrode is printed and connected to a corresponding via. The upper part of the rim is then printed as is the lid, step 422. Once all of the layers have been printed, the device is fired to burn off the sacrificial materials (typically inks) and harden the ceramic and metal layers. The sacrificial material melts and flows through the holes formed in step 406. Depending upon the type of materials used, the firing process may instead be a curing process or any appropriate method of hardening the materials deposited by the screen-printing steps. After firing or curing, the bimorph or multimorph is poled to make it piezoelectric if necessary. The device can then be connected to or integrated with the electrical circuit for which it is to provide electrical power.

In one embodiment, the screen printing process that forms the package and piezoelectric bimorph involves laying down successive layers of different materials embodied in ink or ink-like substances. Some of the ink layers comprise the ceramic or similar material for the case, and others comprise the metal layers for the cantilever and the vias, while still others are sacrificial inks to form the hollow areas of the device. Once all of the layers have been stacked and formed, the device consisting of the case, the cantilever beam, the vias and the proof mass are all formed as one unit. This structure is co-fired to remove the sacrificial material and harden the ceramic and metal material. This produces the cavity around the cantilever and provides clearance when it vibrates.

Figure 5:
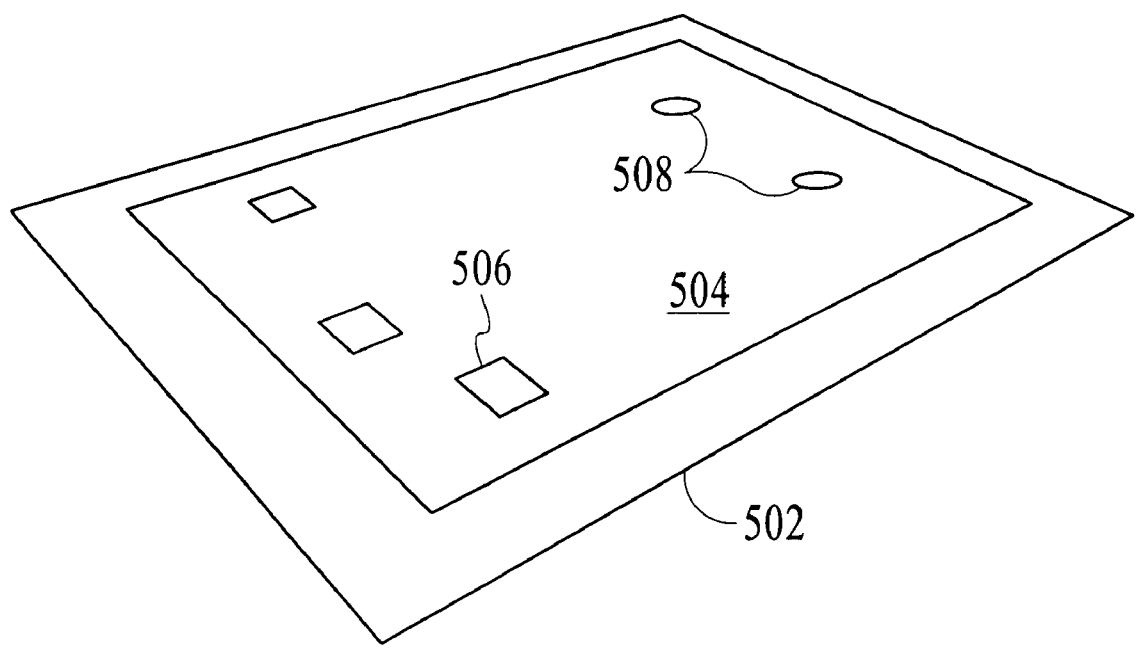
FIG. 5 illustrates a carrier or substrate upon which a ceramic substrate and surface mount pads have been printed, under an embodiment.

FIGS. 5 through 11 illustrate the progression of manufacturing steps to produce an energy harvesting device, such as that illustrated in FIG. 3 and in accordance with the method described in the flowchart of FIG. 4. FIG. 5 illustrates a carrier or substrate 502 upon which a ceramic substrate 504 and surface mount pads 506 have been printed. The substrate 502 can be a ceramic or similar inert material that provides sufficient backing and support for the screen printing process that is used to form the device. The bottom plate 504 can be a ceramic material or other material that is provided in a liquid or semi-liquid form for deposition on the substrate through a screen printing process. The material should be selected such that when dry, it is sufficiently hard and rigid to provide a solid structure for the vias 506, piezoelectric cantilever, and walls that will be formed thereon. Since the device is a structure that encloses a hollow cavity in which the cantilever is formed, several sacrificial layers are used to mask the ceramic and metal inks during the screen printing process. The masked areas generally define the hollow or void areas within the device. In one embodiment, flow holes 508 are formed in the bottom plate to allow the inks for the sacrificial layers to exit upon firing of the device.

Figure 6:
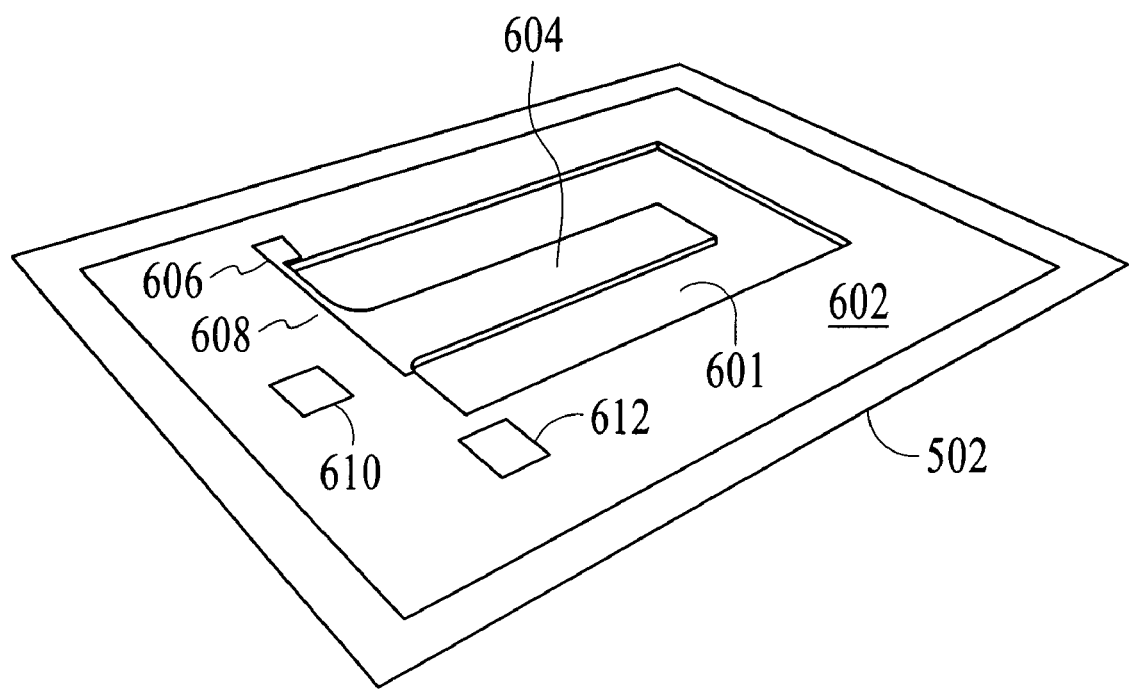
FIG. 6 illustrates the formation of walls upon the substrate of FIG. 5.

The walls that form the sides of the device are formed by printing a ceramic (or similar material) rim upon the bottom plate. FIG. 6 illustrates the formation of walls 602 upon the substrate of FIG. 5. A sacrificial ink layer 601 is deposited on the bottom plate to define the cavity in which the cantilever beam is formed, and layers ceramic are built up around this cavity to define the side walls of the device. At the same time, the two or more layers of the cantilever beam and the vias are formed. In one embodiment, the cantilever beam is a sandwich structure of two or more electrode layers separated by inert ceramic layers. Each electrode layer is a metal layer that is connected directly to a corresponding via or formed as part of the same layer as the via, and each via is connected directly to a corresponding surface mount pad. As shown in FIG. 6, a first electrode layer 604 for the cantilever beam is formed by depositing the metal layer onto the sacrificial ink 601 that forms the cavity of the device. To allow vertical movement of the beam a sufficient gap should be provided between the first layer of the cantilever beam and the top surface of the bottom plate. The first electrode layer of the cantilever 604 is directly connected to via 606 through conductive path 608. Electrode 604, via 606 and path 608 can all be formed by the same screen printing step by depositing a metal layer in the appropriate pattern. In this same step, the remaining vias 610 and 612 can be built-up.

Figure 7:
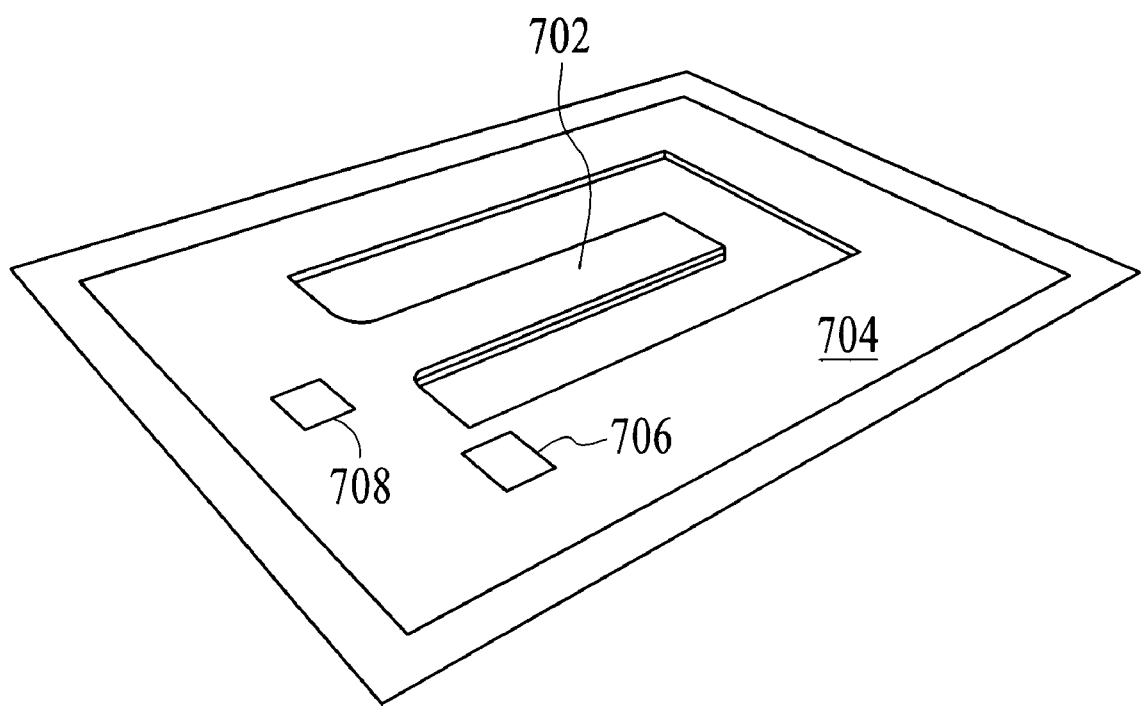
FIG. 7, which illustrates the deposition of a ceramic layer of a piezoelectric cantilever beam of FIG. 6.
Figure 8:
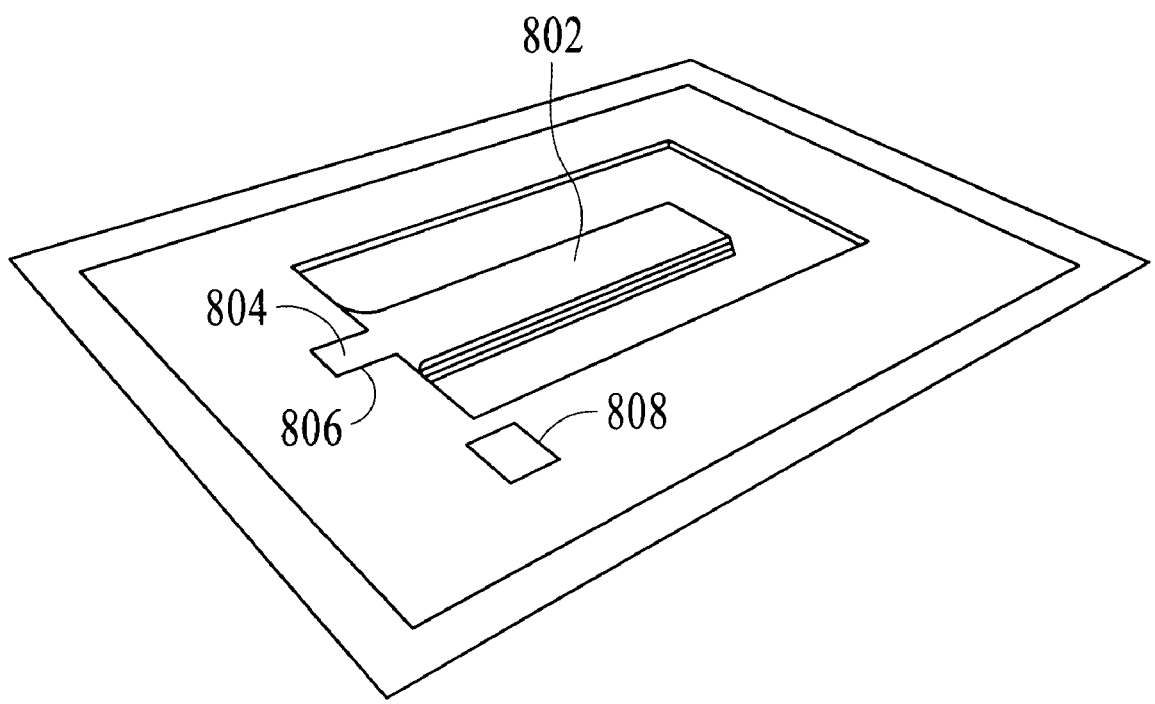
FIG. 8 illustrates the formation of the second electrode on the cantilever beam of FIG. 7.

After the first metal electrode layer is deposited a second ceramic layer is deposited. This is illustrated in FIG. 7, which shows the deposition of a ceramic layer of the cantilever beam of FIG. 6. This ceramic layer adds an inert layer to the cantilever beam 702 and further builds up the walls 704. This layer also covers the first via 606 and trace 608. A metal layer is deposited to build up the remaining vias 706 and 708. FIG. 8 illustrates the formation of the second electrode on the cantilever beam of FIG. 7. As shown in FIG. 8, the second or middle electrode 802 is formed by depositing a metal layer on the cantilever beam and providing a trace 804 to the corresponding via 806. This metal layer also builds up remaining via 808. After the second electrode layer is printed, additional ceramic layers are printed to build up the wall and provide the next ceramic layer for the cantilever beam. The third or upper electrode is then formed by depositing another metal layer.

Figure 9:
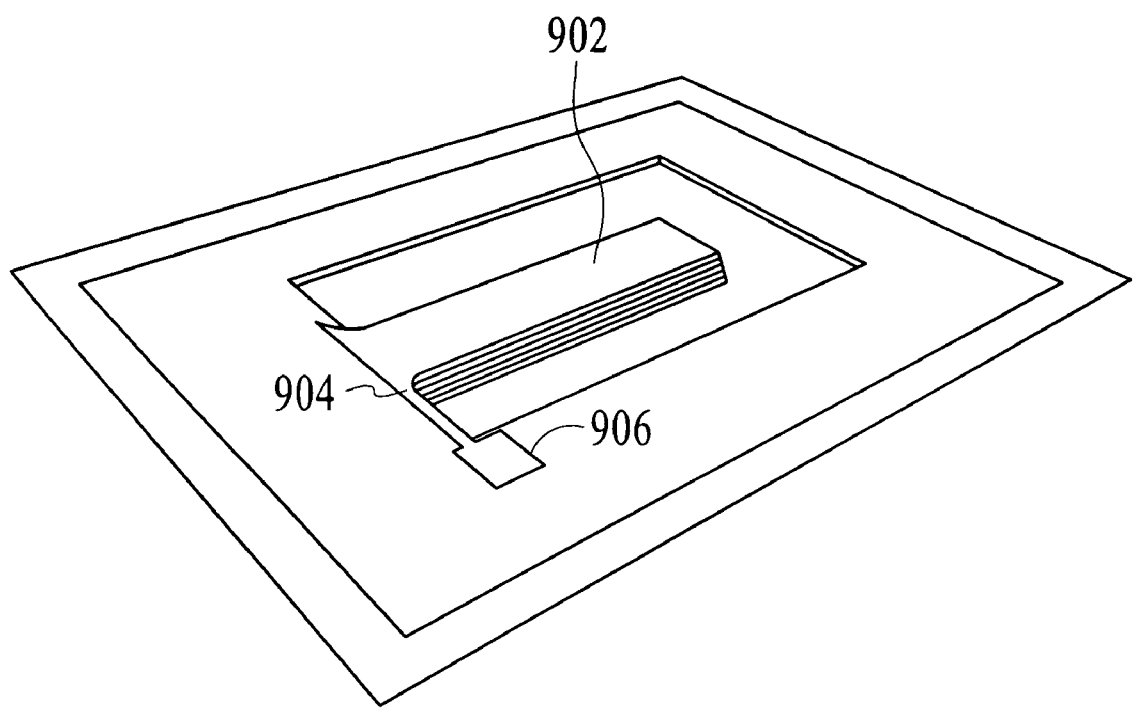
FIG. 9 illustrates the formation of the third electrode on the cantilever beam of FIG. 8.
Figure 10:
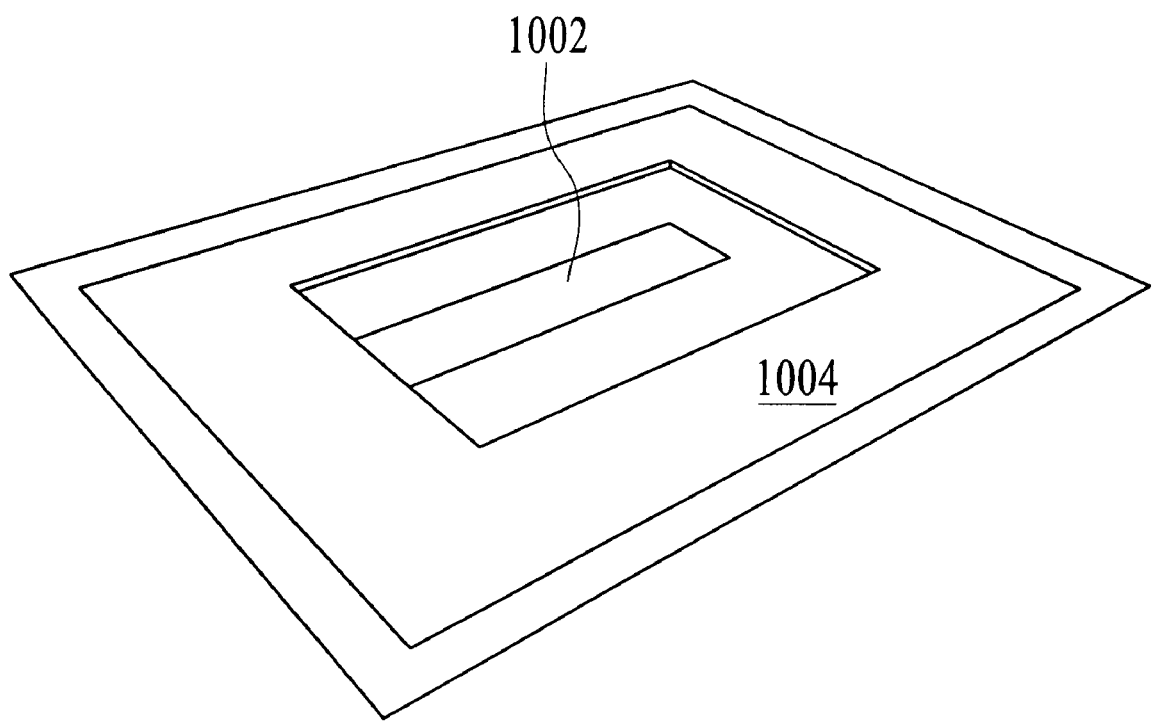
FIG. 10 illustrates the deposition of rim layers and sacrificial ink material over the cantilever beam of FIG. 9.

FIG. 9 illustrates the formation of the third electrode on the cantilever beam of FIG. 8. As shown in FIG. 9, the third or upper electrode 902 is formed by depositing a metal layer on the cantilever beam and providing a trace 904 to the corresponding via 906. After the final electrode layer of the cantilever beam is printed, the wall is further built up to provide adequate top clearance for the vertical movement (oscillation) of the beam and the attachment of any proof mass. FIG. 10 illustrates the deposition of rim layers 1004 and sacrificial ink material 1002 over the cantilever beam of FIG. 9. The sacrificial ink covers the beam structure and masks the ceramic layers that are printed to further build up the rim wall 1004.

Figure 11:
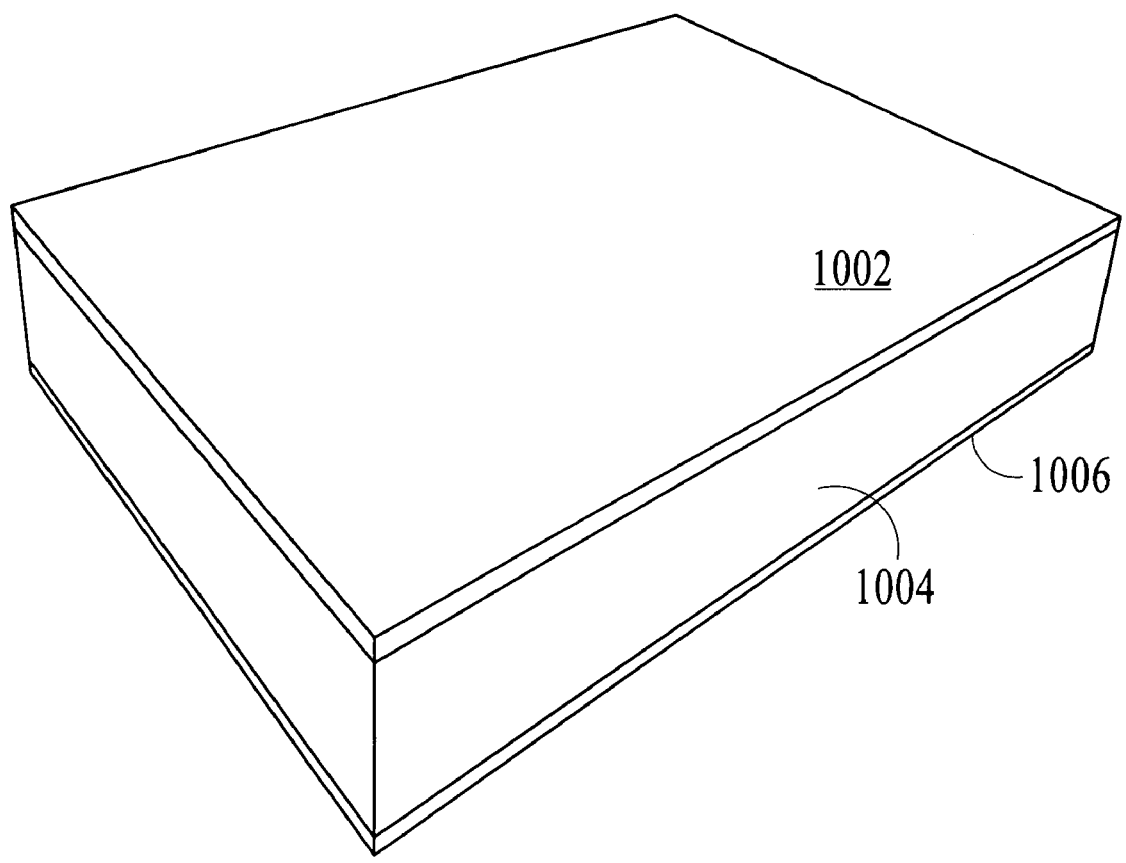
FIG. 11 illustrates the formation of a lid on the rim structure of FIG. 10.

After a sufficient rim height is reaches, the device is enclosed by forming a lid that covers the cavity enclosing the cantilever beam. FIG. 11 illustrates the formation of a lid on the rim structure of FIG. 10. In one embodiment, the lid 1002 is formed by depositing one or more ceramic layers on the previously formed rim walls by the same screen printing process used to form the walls. Thus, as shown in FIG. 11, the lid 1002 is situated on the wall 1004 and together with bottom plate 1006, fully encloses the cantilever beam formed within the device. Alternatively, the lid 1002 that covers the device can be formed as a separate element that is glued or otherwise bonded onto the top surface of the rim wall 1004. The bottom plate has attached to it, or formed therein surface mount pads that are directly connected to respective vias to the corresponding electrodes of the cantilever beam.

In one embodiment, the piezoelectric material that is used to form the electrodes of the cantilever beam is Lead Zirconate Titanate (PZT), such as a PZT-5A type ceramic. Any similar material may be used, and such material is layered by the print forming method described above. The material may be provided in the form of a paste (e.g., powder plus binder) or liquid or semi-liquid form that is capable of being processed by the screen forming process. Depending upon the application of the energy harvesting device, and the power output required, a proof mass may be attached to the cantilever beam to amplify the output energy based on the input force. In one embodiment, the proof mass is made of a material that can be co-fired with PZT, and is formed in layers by the same print forming process used to form the cantilever beam and device walls.

Once the device is enclosed between the lid and bottom plate, as shown in FIG. 11, it is heated in a kiln or similar heating apparatus in a firing process. This process melts the sacrificial ink layers that exit through the holes formed in the bottom plate and leaves an open cavity around the cantilever beam. The firing step also hardens the metal and ceramic layers to that upon cooling a rigid assembly is produced. The evacuation holes in the bottom plate can be filled in or capped if the unit is required to be fully sealed. One or more firing steps can be used depending upon the materials and physical characteristics of the device. If a single firing step is employed, the materials selected for the metal and ceramic layers comprising the electrodes and walls respectively should be matched so that they harden at approximately the same temperature. For example, the electrodes can be formed using Silver Palladium, while the case can be formed using $Al_2O_3$. Alternatively, a material such as Platinum can be used for both the electrodes and the case.

Although embodiments have been directed to manufacturing an energy harvesting device using screen printing (print-forming) processes, it should be understood that similar methods to form a device using successive layering of inks or material can also be used, such as tape-up or similar processes.

As illustrated in FIG. 3, the resulting power harvesting device has a piezoelectric bimorph in the form of a cantilever beam that is integrated directly with the body of the device. Through the successive layering process that builds up both the walls of the device and the inert layers of the bimorph to sandwich the electrode layers, the beam is an extension of the body itself. As such, the device comprises a one-piece beam and case with very high rigidity.

The energy harvesting device described and illustrated with respect to the embodiments of FIGS. 3 through 11 comprised a standalone power supply device that can be coupled to one or more external circuits to provide power for those circuits. In an alternative embodiment, passive electronic components can be integrated with the power harvesting device by forming these components in the same print forming manufacturing process. Such an integrated device can act as a self contained sensor or similar MEMS device. In one embodiment, the integrated energy harvesting device and sensor circuitry comprises a tire pressure monitoring system (TPMS) that is embedded in a tire or wheel, although other similar sensor applications in which a source of vibration energy is available are also possible.

Figure 12A:
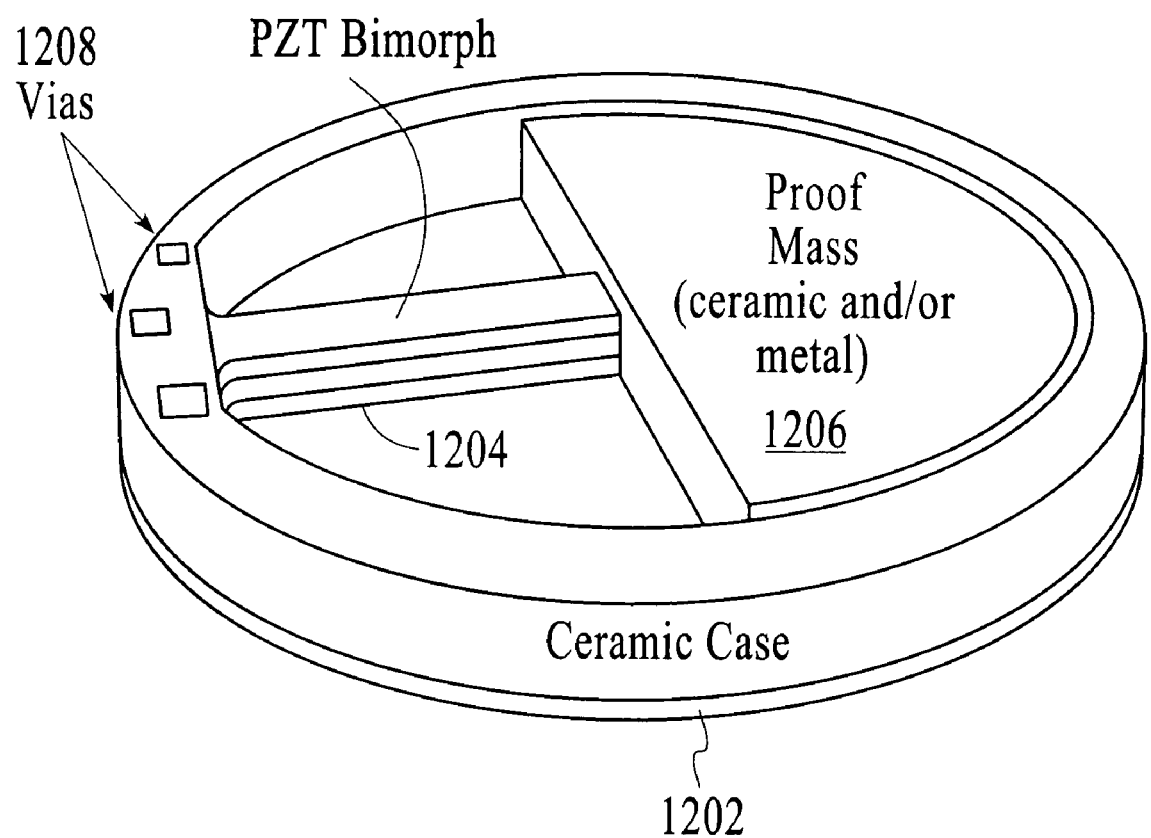
FIG. 12A illustrates an energy harvesting device with a proof mass formed within a case for integration with passive electronic components.

In one embodiment, a power harvesting device created by a print forming process, such as the EoPlex process (or a similar process) is created within a case that forms part of the circuit substrate. FIG. 12A illustrates an energy harvesting device with a proof mass formed within a case for integration with passive electronic components. A piezoelectric bimorph 1204 forming a cantilever beam is formed from a ceramic case 1202. One or more vias 1208 provide connection for the electrical components that will be included in the device.

Figure 12B:
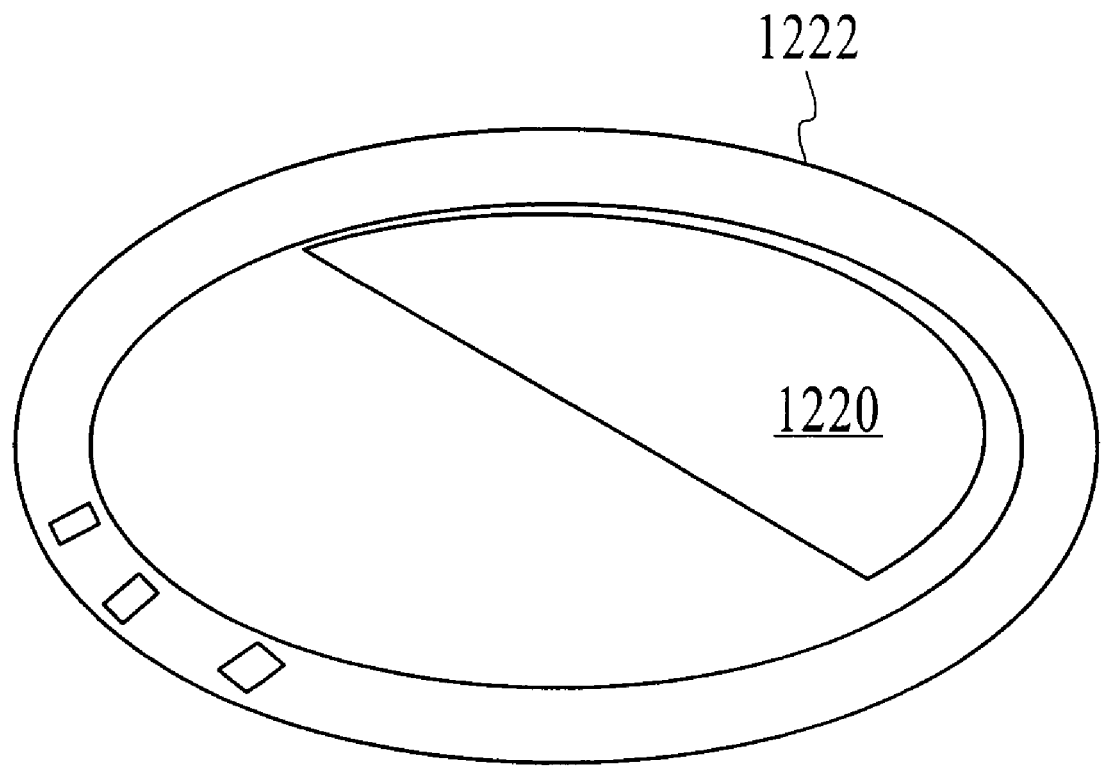
FIG. 12B illustrates the deposition of a proof mass through a print forming method, under an embodiment.
Figure 12C:
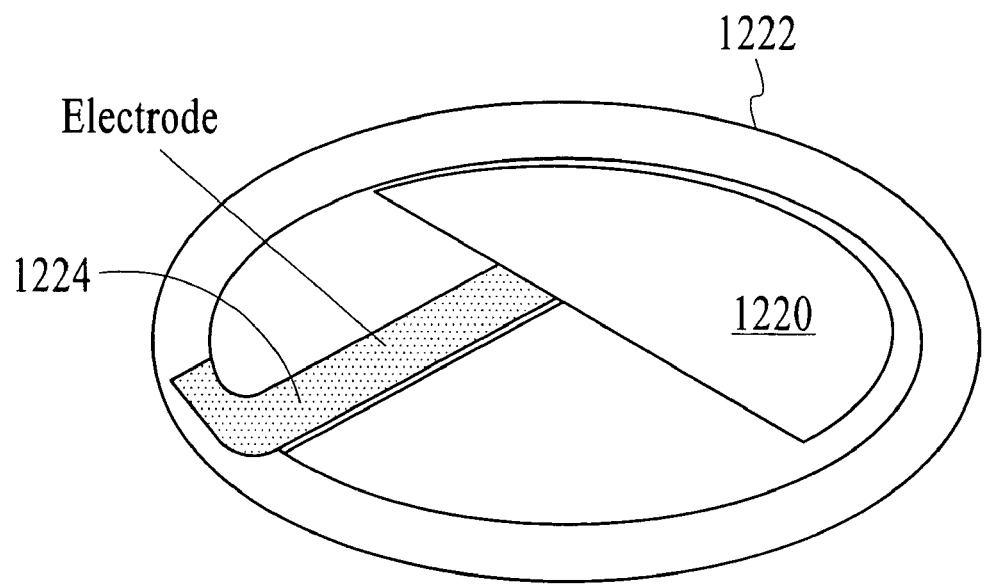
FIG. 12C illustrates the formation of an electrode layer of a cantilever beam with the proof mass formed as shown in FIG. 12B.
Figure 12D:
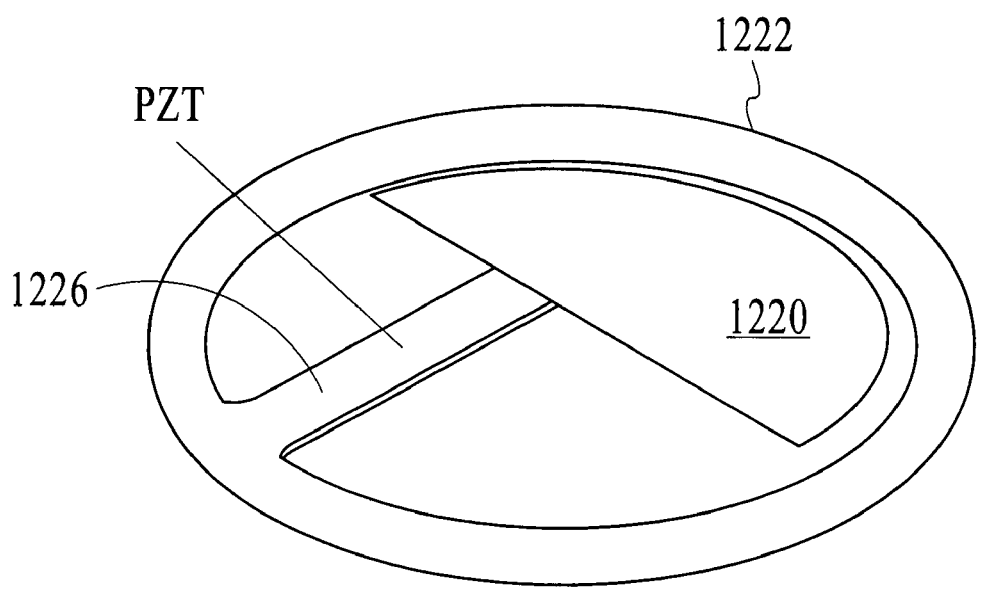
FIG. 12D illustrates the formation of a PZT layer of a cantilever beam with the proof mass formed as shown in FIG. 12B.

As shown in FIG. 12A, a proof mass 1206 is attached or formed as part of the bimorph cantilever 1204. As stated above, the proof mass may be formed in layers by the same print forming process used to form the cantilever beam and device walls (rim structure). FIGS. 12B through 12D illustrate the formation of the proof mass and its integration with the cantilever beam, under an embodiment. As shown in FIG. 12B, the proof mass 1220 is formed within the rim structure 1222 by depositing layers of material through the print forming method. During the deposition stage, alternating layers corresponding to the electrode elements 1224 of the piezoelectric beam are deposited, as shown in FIG. 12C; and alternating layers corresponding to the PZT elements 1226 of the piezoelectric beam are deposited in between the electrode layers, as shown in FIG. 12D. In this manner, the proof mass is formed as an integrated part of the piezoelectric beam. For an embodiment in which the energy harvesting device is produced by a firing process, the proof mass is made of a material that can be co-fired with the PZT material. For this embodiment, the proof mass itself is made of PZT, or a Silver/Palladium (Ag/Pd) alloy, or similar material. For an embodiment in which the device is not made by a firing process, a material such as tungsten can be used.

Figure 13:
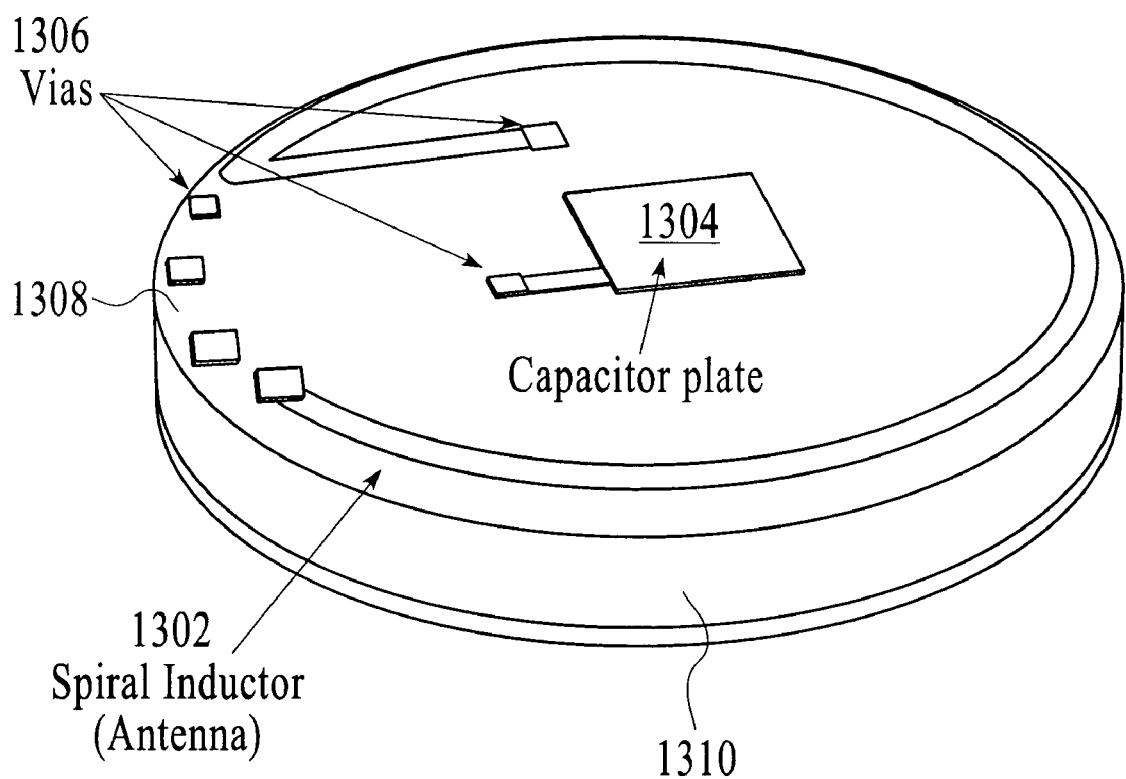
FIG. 13 illustrates the energy harvesting device of FIG. 12A with a first layer of passive components.
Figure 14:
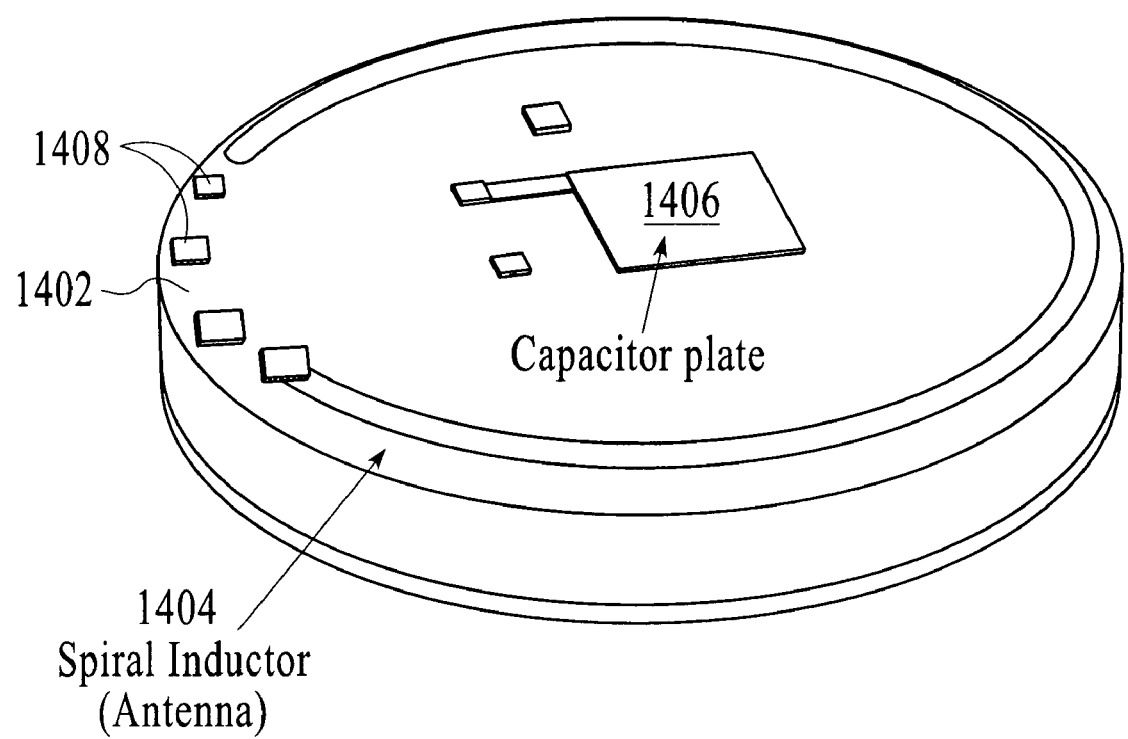
FIG. 14 illustrates the energy harvesting device of FIG. 13 with a second layer of passive components.
Figure 15:
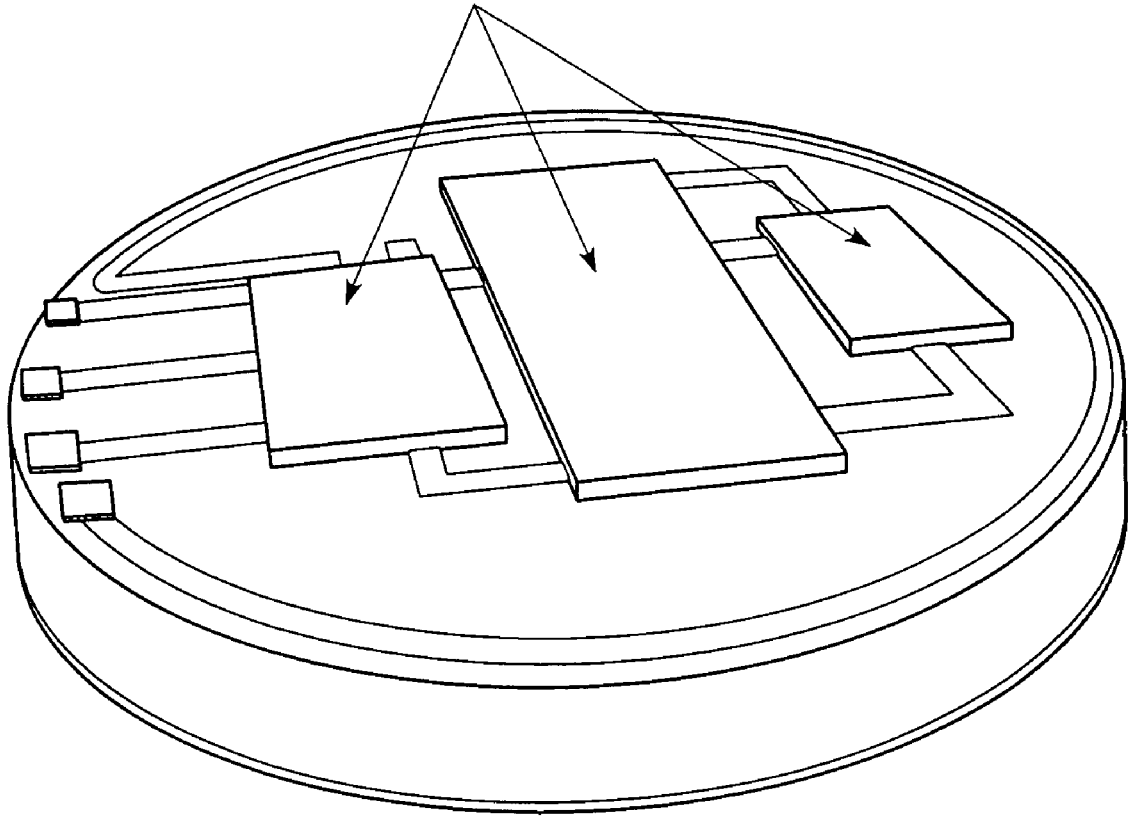
FIG. 15 illustrates the energy harvesting device of FIG. 14 with a top layer of electrical components.

In general, the energy harvesting device illustrated in FIG. 12A is formed by the print forming processes described above. Through this process, a cap layer is also formed over the device, as described with reference to FIG. 11. In one embodiment, the cap layer of the energy harvesting device provides the substrate for the formation of additional electrical circuits. FIG. 13 illustrates the energy harvesting device of FIG. 12A with a first layer of passive components. The cap layer 1308 is formed on the case 1310. On this layer are formed additional components, such as capacitor plate 1304, vias 1306 and spiral inductor 1302. This layer could contain any combination of inductors, capacitors, or interconnection structures. An interlayer ceramic layer is then printed over the first component layer. This layer should have properties designed to improve the performance of the passive elements, such as a high dielectric constant, magnetic permeability, and so on. A second layer of passive components is then printed. FIG. 14 illustrates the energy harvesting device of FIG. 13 with a first layer of passive components. On layer 1402, a second capacitor plate 1406 is formed along with spiral inductor 1404 and vias 1408. Another ceramic interlayer is printed on top of this component layer, and then a top layer structure is printed on this ceramic interlayer. The top layer structure can contain bond pads and additional passive elements. FIG. 15 illustrates the energy harvesting device of FIG. 14 with a top layer of surface mount electrical components 1502. The finished structure is then fired and the piezo material is polarized.

Figure 16:
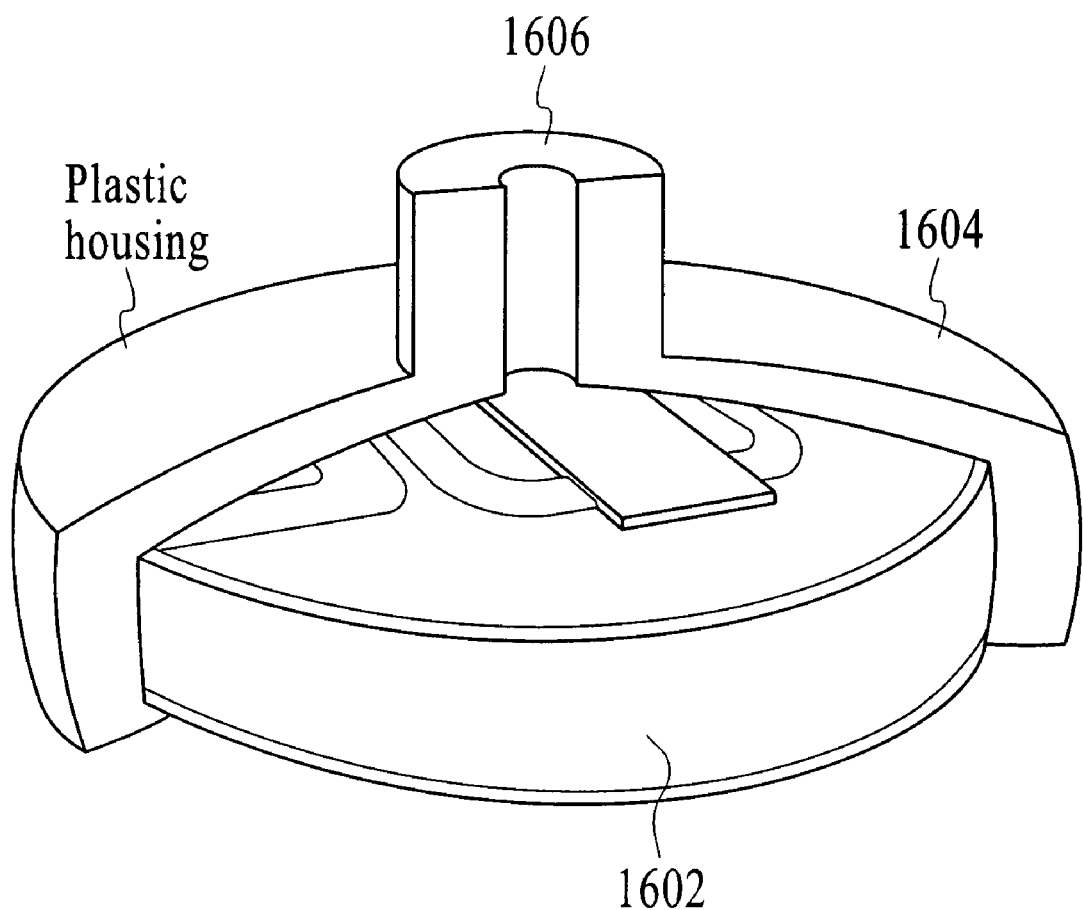
FIG. 16 illustrates a power harvesting device and sensor/transmitter circuit of an intelligent tire system, under an embodiment.

Depending upon the application of the circuit and power harvesting circuit, additional components, such as integrated circuit elements (MEMS and ASICS) can be solder bonded via a flip chip process, or similar method, to the substrate. The system can then be placed inside a plastic housing and embedded in the tire or whatever environment the circuit is to be deployed. FIG. 16 illustrates a power harvesting device and sensor/transmitter circuit of an intelligent tire system, under an embodiment. The integrated power harvesting/component circuit 1602 is encased within plastic housing 1604. For a tire pressure sensing application, a channel 1606 is provided to enable pressure to be measured by the circuit.

The passive electrical components formed in the interlayer regions of the device illustrated in FIGS. 12 through 16 are formed by a print forming process similar or identical to that used to produce the energy harvesting portion of the device. The components placed on the top layer structure can be active semiconductor devices that are soldered onto the top layer, or they could be additional passive components either soldered to the top layer or formed by an additional print forming step. The integrated device, such as device 1602 of FIG. 16 eliminates the need to use a printed circuit board based circuit in conjunction with the energy harvesting device 1202.

Although embodiments have been described in relation to a tire pressure sensor system, it should be understood that these or similar embodiments, can be utilized with respect to a wide variety of other microsystems involving sensors or devices that require and can operate at relatively low power. These include motion sensors, infrared sensors, leak detectors, lubricant monitors, and other applications that have a characteristic that can be measured and feature a vibrating environment. For example, sensors using a piezoelectric bender for electrical power can be mounted within a vehicle fuel tank to monitor fuel quantity or quality, or within an engine crankcase to monitor oil quantity and quality. Embodiments of the energy harvesting device can be applied to many different industries, such as automotive or aerospace applications, industrial machinery, seismic applications, and oceanographic applications, among others.

The sensors used in conjunction with the energy harvesting device can be equipped with any suitable sensing and transmission circuitry, such as RF, microwave, or similar wireless communication means. Alternatively, some applications may be suitable for wired sensor communication.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the energy harvesting device for use with microsystem sensors is not intended to be exhaustive or to limit the embodiments to the precise form or instructions disclosed. While specific embodiments of, and examples for, the energy harvesting device are described herein for illustrative purposes, various equivalent modifications are possible within the scope of the described embodiments, as those skilled in the relevant art will recognize.

The elements and acts of the various embodiments described above can be combined to provide further embodiments. These and other changes can be made to the energy harvesting device in light of the above detailed description.

In general, in the following claims, the terms used should not be construed to limit the described system to the specific embodiments disclosed in the specification and the claims, but should be construed to include all operations or processes that operate under the claims. Accordingly, the described system is not limited by the disclosure, but instead the scope of the recited method is to be determined entirely by the claims.

While certain aspects of the energy harvesting device are presented below in certain claim forms, the inventor contemplates the various aspects of the methodology in any number of claim forms. Accordingly, the inventor reserves the right to add additional claims after filing the application to pursue such additional claim forms for other aspects of the described system.

What is calimed is:

1. A device comprising:
    a housing including a bottom portion and a rim portion integrally formed around a perimeter of the bottom portion, the bottom portion including one or more holes to allow drainage of sacrificial material during a print forming process employed during manufacture of the device;
    a substrate strip constituting part of a cantilever beam formed from the rim portion and protruding over an area of the bottom portion;

first conductive layer laid on top of the substrate strip;
an inert layer laid on top of the first conductive layer;
a second conductive layer laid on top of the inert layer;
a first via formed within the rim portion and coupled to the first conductive layer;
a second via formed within the rim portion and coupled to the second conductive layer;
a proof mass attached to the cantilever beam;
a void area separating the cantilever beam from the bottom portion, the void area configured to allow at least one end of the cantilever beam to move vertically relative to the bottom portion in response to movement of the device, the void area formed by drainage of the sacrificial material through the holes during the print forming process;
a lid placed on a top area of the rim portion to seal the cantilever beam within the void area;
a first surface mount pad on a surface of the lid and coupled to the first via; and
a second surface mount pad on the surface of the lid and coupled to the second via.

2. The device of claim 1, wherein the first and second conductive layers each comprises a piezoelectric material.

3. The device of claim 2, wherein the piezoelectric material comprises Lead Zirconate Titanate (PZT) and each of the bottom portion, rim portion and lid comprises a ceramic material.

4. The device of claim 3 further comprising one or more passive electronic elements integrated within the case and deposited onto the surface of the lid by the print forming process.

5. The device of claim 1 wherein each via and conductive layer is formed by depositing a metal layer during the print forming process.

6. The device of claim 1 wherein the cantilever beam is configured to deflect in a direction corresponding to a vibration force induced onto the proof mass and generate an electric current in response to the vibration force.

7. The device of claim 6, wherein the electric current is provided to a sensor device mounted in a system containing the device to provide operating power to the sensor device.

8. An energy harvesting device comprising:
a case made of a hardened ceramic material, the case comprising a wall structure and a bottom portion encompassing a cavity, the bottom portion including one or more holes to allow drainage of sacrificial material during a print forming process employed during manufacture of the device;
a piezoelectric cantilever beam disposed within the cavity and integrally formed as part of the wall structure, the piezoelectric cantilever beam comprising at least two conductive layers separated by an inert layer;
a first via within the wall structure coupled to the first conductive layer of the at least two conductive layers;
a second via within the wall structure coupled to the second conductive layer of the at least two conductive layers;
a lid placed on a top area of the wall structure to seal the piezoelectric cantilever beam within the cavity, wherein a portion of the cavity separates the piezoelectric cantilever beam from the bottom portion, and is configured to allow at least one end of the piezoelectric cantilever beam to move vertically relative to the bottom portion in response to movement of the device, the cavity formed by drainage of the sacrificial material through the holes during the print forming process;
a first surface mount pad on a surface of the lid and coupled to the first via; and
a second surface mount pad on the surface of the lid and coupled to the second via.

9. The device of claim 8, wherein the case and piezoelectric cantilever beam and lid are formed by a print forming process consisting of printing successive layers of ceramic material and metal material on a substrate.

10. The device of claim 9, wherein the wherein the sacrificial material comprises an ink.

11. The device of claim 10, further comprising the step of forming a proof mass through the print forming method such that it forms an integral part of the piezoelectric cantilever beam.

12. The device of claim 10 wherein the piezo bimorph strip is configured to deflect within the cavity and in a direction corresponding to a vibration force induced onto the proof mass and generate an electric current in response to the vibration force to provide operating power to a circuit coupled to the device.

13. The device of claim 12, wherein the piezoelectric material comprises Lead Zirconate Titanate (PZT), and the proof mass comprises one of PZT and silver/palladium alloy.

14. The device of claim 10, further comprising one or more passive electronic elements integrated within the case and deposited onto the case by the print forming process.

15. The device of claim 9, wherein the device comprises part of a power circuit for an air pressure sensor.

16. The device of claim 15, wherein the air pressure sensor and power circuit are mounted inside the tire of a vehicle.

* * * * *